(12) United States Patent
Goto

(10) Patent No.: US 6,599,819 B1
(45) Date of Patent: Jul. 29, 2003

(54) SEMICONDUCTOR DEVICE WITH SOURCE/ DRAIN REGIONS OF HIGH IMPURITY CONCENTRATION AND ITS MANUFACTURE

(75) Inventor: Kenichi Goto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/576,810

(22) Filed: May 23, 2000

(30) Foreign Application Priority Data

May 26, 1999 (JP) .......................................... 11-146707

(51) Int. Cl.[7] .............................................. H01L 21/22
(52) U.S. Cl. ...................... 438/542; 438/217; 438/289; 438/291; 438/197; 438/299; 438/303; 438/305; 438/307; 438/527; 438/529
(58) Field of Search ....................... 438/217, 289–291, 438/197, 299, 303, 305–307, 527, 529, 542

(56) References Cited

U.S. PATENT DOCUMENTS 5,401,666 A * 3/1995 Tsukamoto ................. 438/305
5,474,940 A * 12/1995 Tsukamoto ................. 438/289
5,899,732 A * 5/1999 Gardner et al. ............. 438/473
6,180,464 B1 * 1/2001 Krivokapic et al. ........ 438/174

* cited by examiner

Primary Examiner—Matthew Smith
Assistant Examiner—V. Yevsikov
(74) Attorney, Agent, or Firm—Armstrong, Westerman & Hattori, LLP

(57) ABSTRACT

A gate electrode is formed in a partial area of the surface of a semiconductor substrate. Impurities of a first conductive type are implanted into the semiconductor substrate in areas on both sides of the gate electrode, by using the gate electrode as a mask. The implanted impurities are activated by applying a laser beam to the surface of the semiconductor substrate. Impurities to be used for threshold voltage control are implanted into the surface layer of the semiconductor substrate under the gate electrode, after the laser beam is applied. The impurities for threshold voltage control are activated by heating the semiconductor substrate. A semiconductor device is provided having a low parasitic resistance of source/drain regions and a desired threshold voltage hard to be lowered.

4 Claims, 6 Drawing Sheets

SEMICONDUCTOR DEVICE WITH SOURCE/DRAIN REGIONS OF HIGH IMPURITY CONCENTRATION AND ITS MANUFACTURE

This application is based on Japanese Patent Application HEI 11-146707, filed on May 26, 1999, the entire contents of which are incorporated herein by reference.

BACKGROUND OF THE INVENTION a) Field of the Invention

The present invention relates to a method of manufacturing semiconductor devices whose impurities are activated through laser annealing and to such semiconductor devices.

b) Description of the Related Art

A conventional general manufacture method for MOS transistors will be described first. After element separation regions are formed in the surface layer of a silicon substrate to define active regions, impurities are doped in the active regions for the control of threshold voltage. A gate electrode is formed on each active region, and impurities are doped shallowly into source/drain regions on both sides of the gate electrode. Side wall spacers are formed on the side walls of the gate electrode, and impurities are doped deeply into source/drain regions outside the side wall spacers. Rapid thermal annealing (RTA) is performed to activate the impurities doped into the source/drain regions.

As MOS transistors are formed finely and the channel resistance lowers, the resistance of the source/drain regions increases relatively. The resistance of the source/drain regions of a MOS transistor having a gate length of 0.1 $\mu$m becomes as large as 30 to 50% of the total resistance. The main factor of raising the resistance of the source/drain regions is the shallow junction portion under the side wall spacer. If the activated impurity concentration in this shallow junction portion is raised to lower the resistance thereof, parasitic resistance of the source/drain regions can be lowered.

It is difficult to activate impurities having a concentration of $1 \times 10^{20}$ cm$^{-3}$ by using RTA. Impurities having a higher concentration can be activated if laser annealing techniques are utilized. If the concentration of impurities in the shallow junction portion under the side wall spacer is raised by laser annealing, the resistance of the shallow junction portion can be lowered.

Although the parasitic resistance of the source/drain regions can be lowered by laser annealing, it has been found that MOS transistors manufactured by using laser annealing techniques have a low threshold voltage and an increased off-current.

SUMMARY OF THE INVENTION

It is an object of the present invention to provide a method of manufacturing a semiconductor device, capable of lowering a parasitic resistance of source/drain regions and making its threshold voltage hard to be lowered.

It is another object of the present invention to provide a semiconductor device having a low parasitic resistance of source/drain regions and a desired threshold voltage.

It is another object of the present invention to provide a method of manufacturing a semiconductor device capable of lowering a contact resistance between an impurity diffused region and a connection wire.

According to one aspect of the present invention, there is provided a method of manufacturing a semiconductor device, comprising: a step of forming a gate electrode in a partial area of a surface of a semiconductor substrate; a first impurity implantation step of implanting impurities of a first conductive type into the semiconductor substrate in areas on both sides of the gate electrode, by using the gate electrode as a mask; a step of activating the impurities implanted by the first impurity implantation step by applying a laser beam to the surface of the semiconductor substrate; a step of implanting impurities for controlling threshold voltage into a surface layer of the semiconductor substrate under the gate electrode, after the laser beam is applied; and a step of activating the impurities for controlling threshold voltage by heating the semiconductor substrate.

Activation of impurities by laser annealing can increase the concentration of activated impurities more than activation by RTA. Parasitic resistance of a semiconductor device can therefore be lowered.

According to another aspect of the present invention, there is provided a method of manufacturing a semiconductor device comprising the steps of: implanting first impurities of a second conductive type into a surface layer of a semiconductor substrate in an area doped with impurities of a first conductive type opposite to the second conductive type; forming an impurity diffusion region of the second conductive type having a p-n junction at a first depth from a surface of the semiconductor substrate, by heating the semiconductor substrate and activating the first impurities; implanting second impurities of the second conductive type in a shallower area than the first depth in the impurity diffusion region; and activating the second impurities by applying a laser beam to the surface of the semiconductor substrate.

The impurity diffusion region formed by laser radiation is in the impurity diffusion region of the same conductive type as the first-mentioned impurity diffusion region. Although defects are generated near the boundary between the impurity diffusion region activated by laser radiation and the region around the impurity diffusion region, they are not generated near the p-n junction interface. It is possible to prevent an increased leak current to be caused by defects.

As above, the shallow junction portion in the source/drain region in contact with the channel is formed by laser annealing so that the concentration of activated impurities can be made high. Parasitic resistance of the source/drain regions can be lowered. Since impurities for controlling threshold voltage are implanted into the channel region after laser annealing, it is possible to set impurity concentration in the channel region for desired value. It is therefore possible to prevent the threshold voltage from being lowered and the off-current from being increased.

DETAILED DESCRIPTION OF THE PREFERRED EMBODIMENTS

Prior to describing embodiments of the invention, a problem will be described which occurs if a shallow junction portion of a source/drain region under a side wall spacer is formed by a conventional method using laser annealing. According to the experiments made by the present inventor, it has been found that the threshold voltage of a MOS transistor is lower than a design value if the conventional method is used. This may be ascribed to that impurities for controlling threshold voltage doped into the channel region are attracted toward the source/drain regions during laser annealing and the impurity concentration in the channel region is lowered. In each of embodiments to be described in the following, it is possible to prevent impurities in the channel region from being attracted to the source/drain-regions.

Figure 1A:
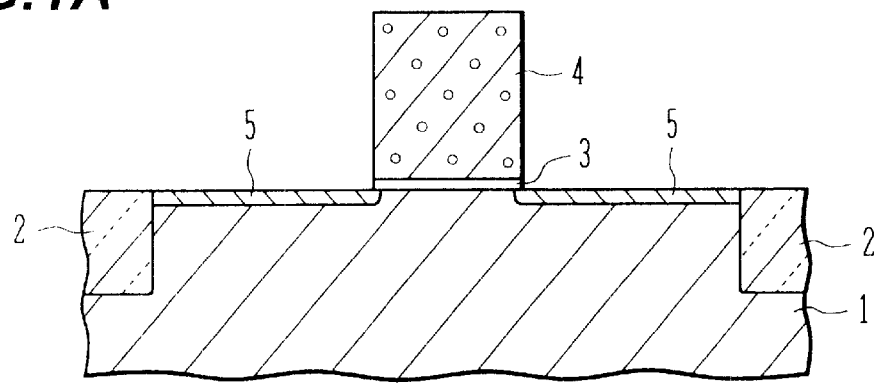
FIGS. 1A to 1C are cross sectional views of a semiconductor device illustrating a semiconductor device manufacture method according to a first embodiment of the invention.
Figure 1B:
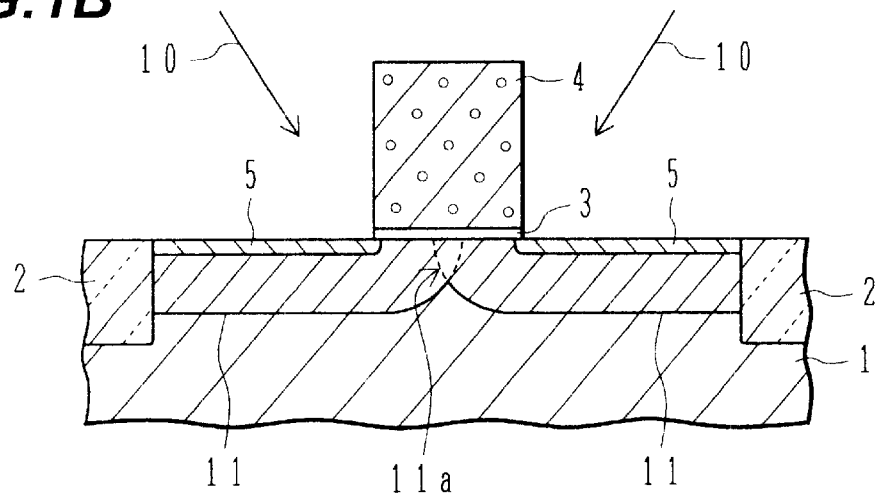
Figure 1C:
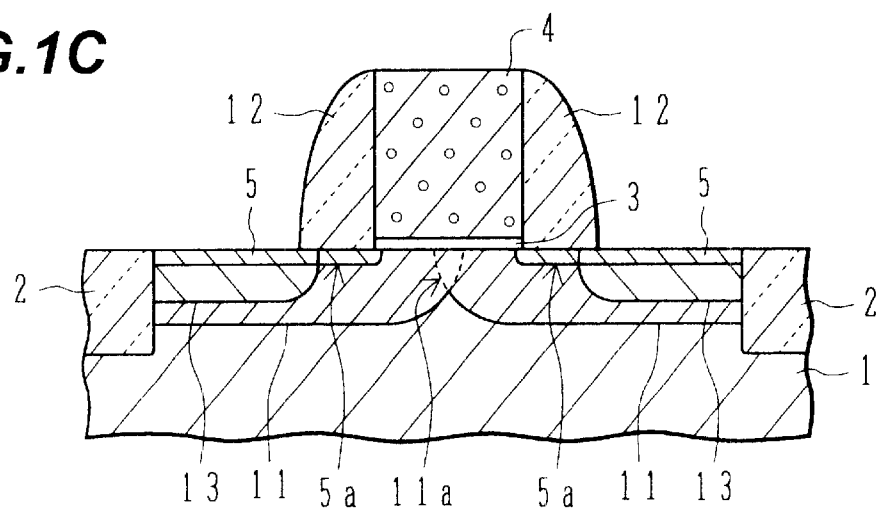

With reference to FIGS. 1A to 1C, a method of manufacturing a semiconductor device according to the first embodiment of the invention will be described.

As shown in FIG. 1A, an element separation structure 2 is formed in the surface layer of a silicon substrate 1 to define an active region. The silicon substrate 1 is already doped with n-type impurities having a concentration of about $1\times10^{15}$ cm$^{-3}$. The element separation structure 2 may be either a shallow trench or a field oxide film formed by local oxidation of silicon (LOCOS).

The surface of the active region is thermally oxidized to form an $SiO_2$ film of 3 nm in thickness. On this $SiO_2$ film, a polysilicon film is deposited to a thickness of 200 nm by CVD. The $SiO_2$ film and polysilicon film are patterned to leave a gate oxide film 3 of $SiO_2$ and gate electrode 4 of polysilicon on the active region.

By using the gate electrode 4 as a mask, $BF_2^+$ ions are implanted in the active regions on both sides of the gate electrode 4, under the conditions of an acceleration energy of 1 keV and a dose of $1\times10^{14}$ cm$^{-2}$. A laser beam is applied to the substrate surface to activate the implanted B ions. For example, the laser beam is applied at a wavelength of 308 nm, at a power of about 1 J/cm$^2$, and during a radiation time of 10 ns. On both sides of the gate electrode 4, p-type impurity diffusion regions 5 are therefore formed. By this laser annealing, the concentration of activated impurities in the impurity diffusion region 5 can be made higher than $1\times10^{20}$ cm$^{-3}$. It is difficult to activate impurities to such a high concentration by RTA.

As shown in FIG. 1B, As$^+$ ions are implanted obliquely into the channel region under the gate electrode 4. The ion implantation conditions are an acceleration energy of 100 keV, a dose of $5\times10^{12}$ cm$^{-2}$ and an incidence angle of 30° to 45°. The incidence angle is an angle between an ion progressing direction and a normal direction of the substrate surface. An ion beam 10 is slanted so that a plane of incidence (parallel to the drawing sheet of FIG. 1B) is perpendicular to the width direction (perpendicular to the drawing sheet of FIG. 1B) of the gate electrode. Ion implantation is performed along two directions, one direction of the ion beam 10 being slanted on one side of the gate electrode 4 and the other direction of the ion beam being slanted on the other side of the gate electrode 4. Ion implantation may be performed along four directions. Alternatively, ions may be implanted at a high energy nearly along the normal direction of the substrate surface to make the ions reach the channel region through the gate electrode 4.

As$^+$ ions implanted under the above condition pass through the gate electrode 4 and reach the channel region under the gate electrode 4. As$^+$ ions implanted into the channel region are used for threshold voltage control. An n-type impurity diffusion region 11 formed by ion implantation with the ion beam being slanted on one side of the gate electrode 4 and an n-type impurity diffusion region 11 formed by ion implantation with the ion beam being slanted on the other side of the gate electrode 4 overlap near in the central area of the channel region. The As concentration in this overlap area 11a is about two times higher than the As concentration in an area between the overlap area 11a and the p-type impurity diffusion region 5.

As shown in FIG. 1C, side wall spacers 12 of $SiO_2$ are formed on the side walls of the gate electrode 4. The side wall spacers 12 are formed by depositing an $SiO_2$ film over the whole substrate surface by CVD and thereafter performing anisotropic etching.

By using the gate electrode 4 and side wall spacers 12 as a mask, B$^+$ ions are implanted under the conditions of an acceleration energy of 7 keV and a dose of $2\times10^{15}$ cm$^{-2}$. After B$^+$ ions are implanted, RTA is executed for 10 seconds at 1000° C. Outside the side wall spacers 12, p-type impurity diffusion regions 13 are therefore formed.

Each of the source/drain regions formed by the embodiment method is constituted of the p-type impurity diffusion region 13 and a shallow junction portion 5a coupling the p-type impurity diffusion region and channel region. The shallow junction region 5a is a portion of the p-type impurity diffusion region 5 activated by laser annealing at the process shown in FIG. 1A. Since the shallow junction portion 5a is formed by laser annealing, the concentration of the activated impurities can be made higher than that by RTA. The resistance of the shallow junction portion 5a can therefore be lowered. In order to obtain sufficient reduction effects of parasitic resistance of the source/drain regions, it is preferable to set the concentration of activated impurity ions in the shallow junction portion 5a to $5\times10^{20}$ cm$^{-3}$ or higher.

Defects, which may be formed on the p-n junction between the shallow junction portion 5a and substrate during laser annealing, can be removed by RTA to be executed later.

In this embodiment, after the laser annealing is performed at the process shown in FIG. 1A, impurities for controlling threshold voltage are implanted at the process shown in FIG. 1B. Since laser annealing is not performed after the impurities for controlling threshold voltage are implanted, the impurities for controlling threshold voltage are not attracted toward the source/drain regions. It is therefore possible to form a MOS transistor having a desired threshold voltage. Generally, impurities for controlling threshold voltage are implanted into the channel region to an impurity concentration of about $1\times10^{17}$ cm$^{-3}$. With the first embodiment method, the impurity concentration for controlling threshold voltage in the channel region can be set to $1\times10^{17}$ cm$^{-3}$ or higher over the whole length between the source and drain regions.

Next, with reference to FIGS. 2A to 2C, a method of manufacturing a semiconductor device according to the second embodiment of the invention will be described. In the second embodiment, the oblique ion implantation process of the first embodiment shown in FIG. 1B is exchanged in order by the ion implantation process for forming the p-type impurity diffusion region 13 shown in FIG. 1C.

Figure 2A:
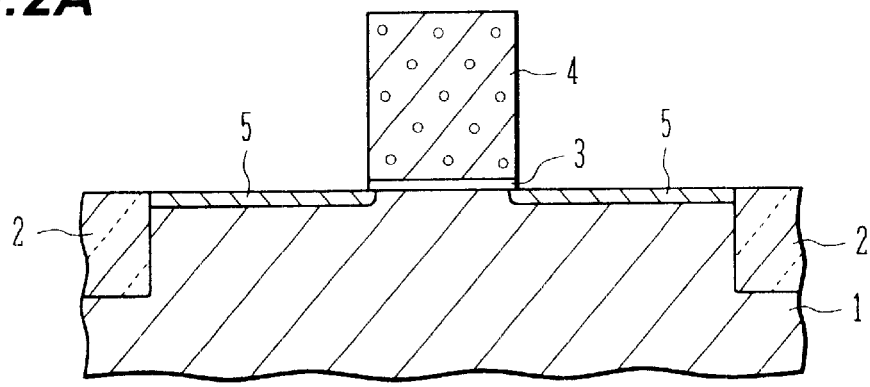
FIGS. 2A to 2C are cross sectional views of a semiconductor device illustrating a semiconductor device manufacture method according to a second embodiment of the invention.

The structure shown in FIG. 2A is the same as the structure shown in FIG. 1A referred to in the first embodiment. By performing the process similar to the first embodiment, the state shown in FIG. 2A is obtained.

Figure 2B:
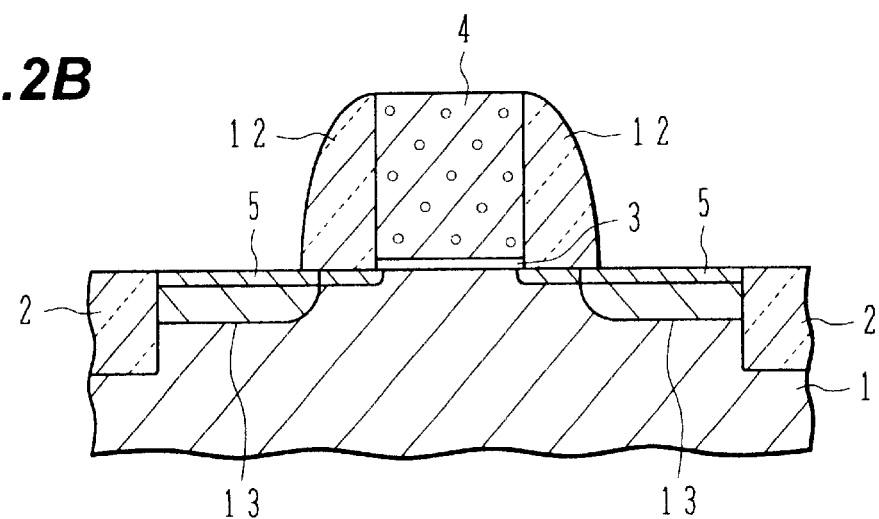

As shown in FIG. 2B, side wall spacers 12 of SiN are formed on the side walls of the gate electrode 4. The side wall spacers 12 are formed by depositing an SiN film over the whole substrate surface by CVD and thereafter performing anisotropic etching. By using the gate electrode 4 and side wall spacers 12 as a mask, $As^+$ are implanted under the same conditions as those for forming the p-type impurity diffusion region 13 of the first embodiment shown in FIG. 1C. Outside the side wall spacers 12, p-type impurity diffusion regions 13 are therefore formed.

Figure 2C:
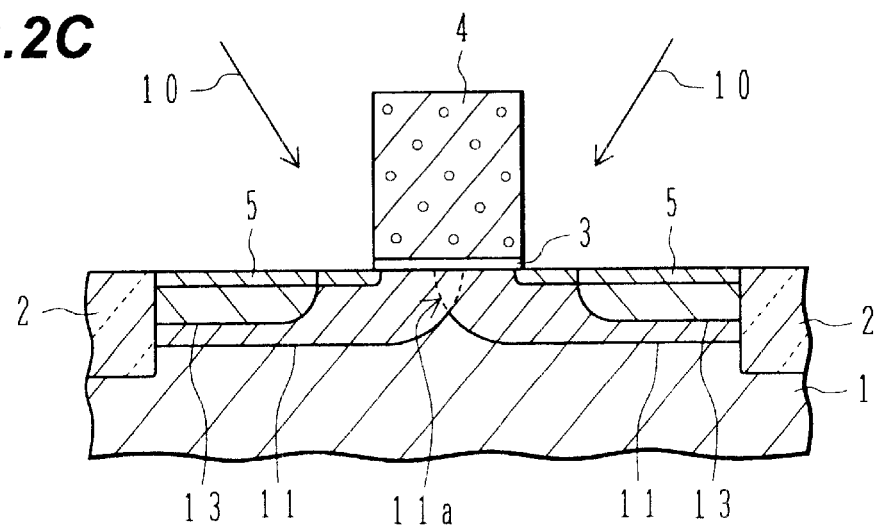

As shown in FIG. 2C, the side wall spacers 12 are removed. $As^+$ ions for controlling threshold voltage are implanted obliquely into the channel region under the gate electrode 4. The ion implantation conditions are the same as those of oblique $As^+$ ion implantation of the first embodiment shown in FIG. 1B. After this ion implantation, RTA is performed for 10 seconds at 1000° C. to activate implanted impurity ions.

Also in the second embodiment, laser annealing is not performed after the impurity ions for controlling threshold voltage are implanted. It is therefore possible to form a MOS transistor having a desired threshold voltage.

In the second embodiment, although $As^+$ ions for controlling threshold voltage are implanted after the side wall spacers 12 are removed, $As^+$ ions may be implanted without removing the side wall spacers 12. In this case, $As^+$ ions are implanted to the channel region, passing through the side wall spacers 12 and gate electrode 4.

Next, with reference to FIGS. 3A to 3C, a method of manufacturing a semiconductor device according to the third embodiment of the invention will be described. In the second embodiment, laser annealing is executed immediately after impurities are implanted into the p-type impurity diffusion region 5 at the process shown in FIG. 2A, whereas in the third embodiment, prior to the laser annealing, impurity ions are implanted to form impurity diffusion regions corresponding to the p-type impurity diffusion regions 13 shown in FIG. 2A.

Figure 3A:
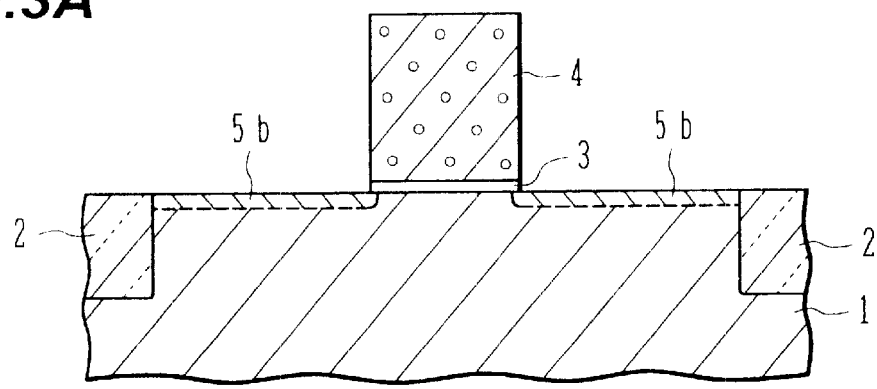
FIGS. 3A to 3C are cross sectional views of a semiconductor device illustrating a semiconductor device manufacture method according to a third embodiment of the invention.

The process up to the state shown in FIG. 3A is almost the same as the process described with FIG. 1A referred to in the first embodiment. In the process described with FIG. 1A, leaser annealing activates impurities in the p-type impurity diffusion region 5, whereas in the process described with FIG. 3A, after impurity ions are implanted to form the p-type impurity diffusion regions 5b, laser annealing is not performed. Therefore, impurities in the p-type impurity diffusion regions 5b are not still activated.

Figure 3B:
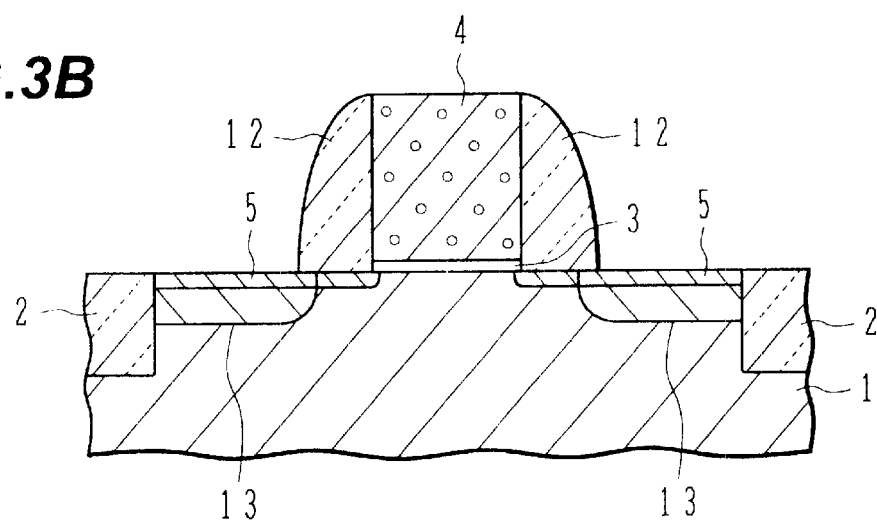

As shown in FIG. 3B, side wall spacers 12 are formed on the side walls of the gate electrode 4. By using the gate electrode 4 and side wall spacers 12 as a mask, $B^+$ ions are implanted under the same conditions as those for forming the p-type impurity diffusion region 13 shown in FIG. 1C.

After the ion implantation, laser annealing is performed. The laser radiation conditions are the same as those for activating impurities in the p-type impurity diffusion region 5 shown in FIG. 1A. With this laser annealing, $B^+$ ions implanted at the process shown in FIG. 3A are activated to form the p-type impurity diffusion region 5, and $B^+$ ions implanted at the process shown in FIG. 3B are activated to form the p-type impurity diffusion region 13 outside the side wall spacers 12.

Figure 3C:
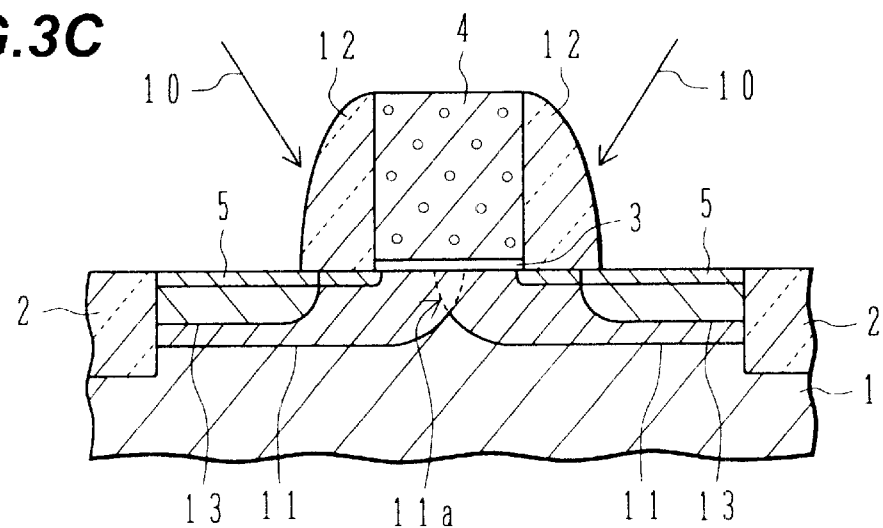

As shown in FIG. 3C, impurity ions for controlling threshold voltage are implanted under the same conditions as those for implanting impurity ions for controlling threshold voltage of the first embodiment shown in FIG. 1C. After this ion implantation, RTA is performed for 10 seconds at 1000° C. to activate the impurities for controlling threshold voltage.

Also in the third embodiment, laser annealing is not performed after the impurity ions for controlling threshold voltage are implanted. It is therefore possible to form a MOS transistor having a desired threshold voltage.

In the third embodiment, although $As^+$ ions for controlling threshold voltage are implanted without removing the side wall spacers 12, $As^+$ ions may be implanted after removing the side wall spacers 12. In this case, in order to selectively remove the side wall spacers 12 relative to the element separation structures 2, the side wall spacers 12 are made of SiN.

Next, with reference to FIGS. 4A to 4C, a method of manufacturing a semiconductor device according to the fourth embodiment of the invention will be described. In the first to third embodiments, the surface of the source/drain regions and the upper surface of the gate electrode are not silicidized. In the fourth embodiments, these surfaces are silicidized.

Figure 4A:
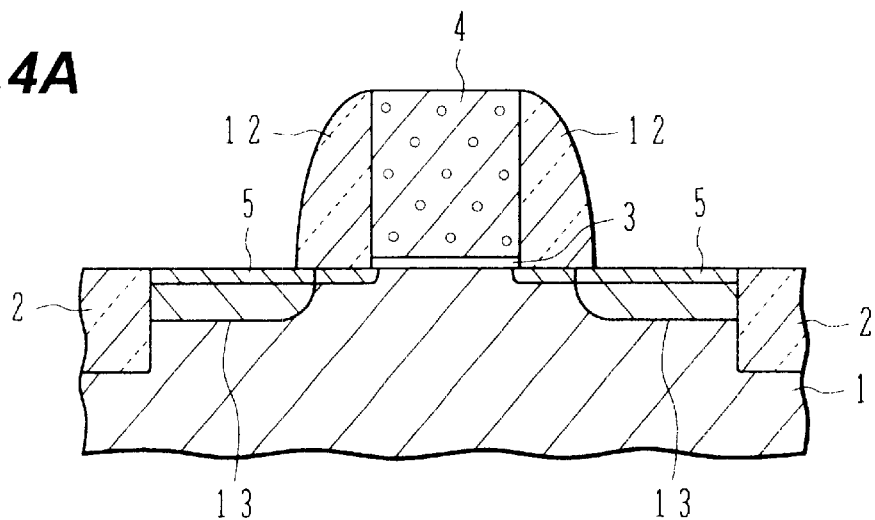
FIGS. 4A to 4C are cross sectional views of a semiconductor device illustrating a semiconductor device manufacture method according to a fourth embodiment of the invention.

The structure shown in FIG. 4A is the same as the structure of the second embodiment shown in FIG. 2B. By performing the process similar to the second embodiment, the structure shown in FIG. 4A is obtained.

Figure 4B:
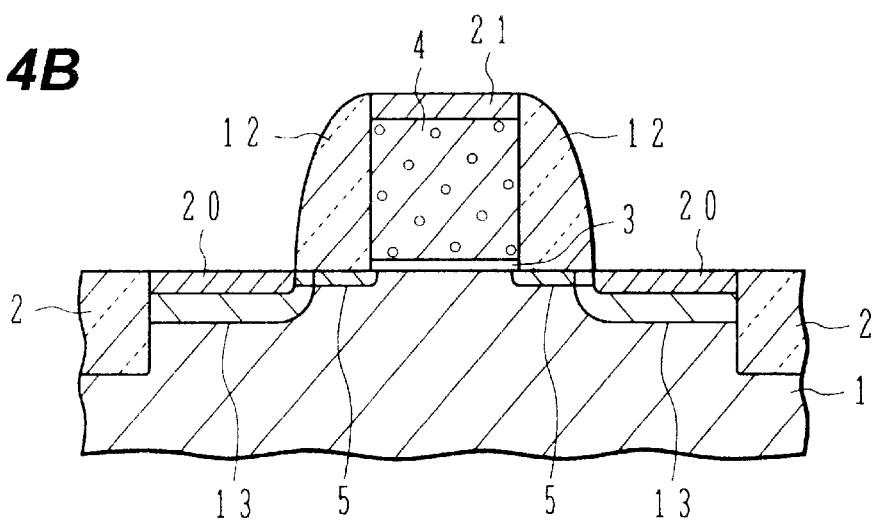

As shown in FIG. 4B, the surface of the p-type impurity diffusion region 13 is covered with a $CoSi_2$ film 20, and the upper surface of the gate electrode 4 is covered with a $CoSi_2$ film 21. A method of forming the $CoSi_2$ films 20 and 21 will be described briefly in the followings.

First, a Co film is deposited on the whole substrate surface by sputtering. Thereafter, heat treatment is executed for 30 seconds at 500° C. This heat treatment induces silicidation reaction at the interface between the Co film and silicon. After the silicidation reaction, the unreacted Co film is removed. A more detailed method of forming a $CoSi_2$ film is described, for example, in the publication of JP-A-6-207034.

Figure 4C:
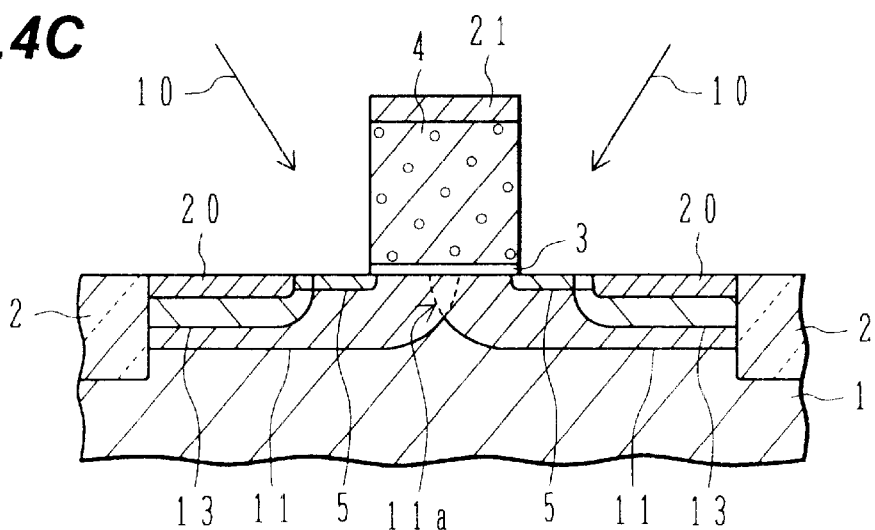

As shown in FIG. 4C, the side wall spacers 12 are removed. Thereafter, $As^+$ ions for controlling threshold voltage are implanted obliquely under the same conditions as those of oblique ion implantation of the first embodiment shown in FIG. 1B.

Also in the fourth embodiment, laser annealing is not performed after the impurity ions for controlling threshold voltage are implanted. It is therefore possible to form a MOS transistor having a desired threshold voltage. In addition, since the $CoSi_2$ film 21 is formed on the upper surface of the gate electrode 4, the resistance of the gate wiring can be lowered. Also, since the $CoSi_2$ film 20 is formed on the surfaces of the source/drain regions, the parasitic resistance of the source/drain regions can be lowered.

Next, with reference to FIGS. 5A to 5C, a method of manufacturing a semiconductor device according to the fifth embodiment will be described.

Figure 5A:
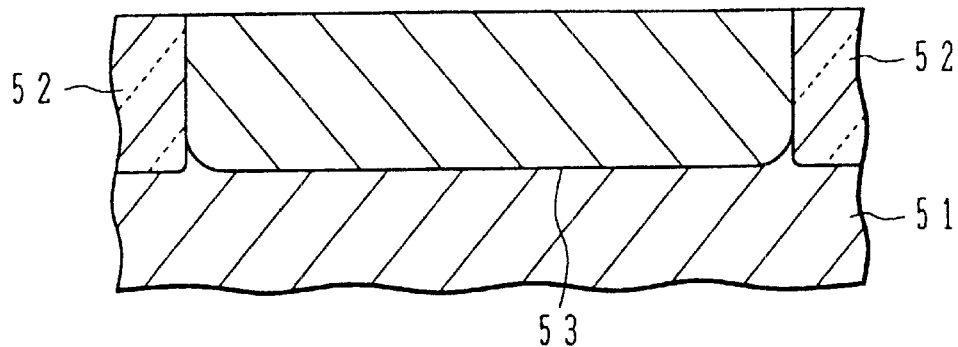
FIGS. 5A to 5C are cross sectional views of a semiconductor device illustrating a semiconductor device manufacture method according to a fifth embodiment of the invention.
Figure 5B:
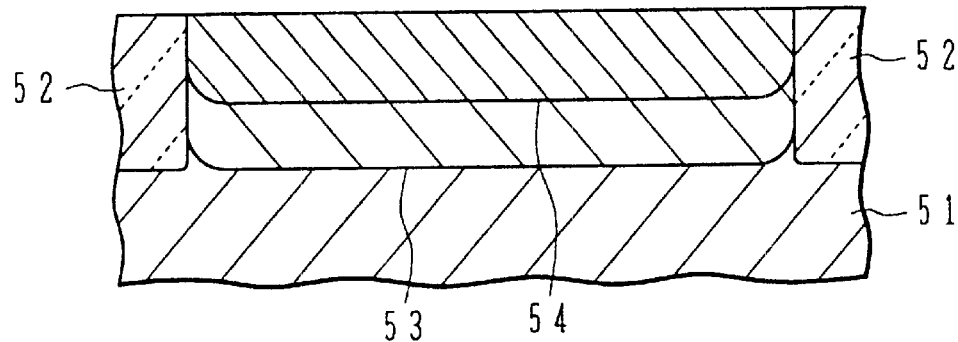

As shown in FIG. 5A, an element separation structure 52 is formed in the surface layer of an n-type silicon substrate 51 to define an active region on the surface of the silicon substrate. $B^+$ ions are implanted into the active region under the conditions of an acceleration energy of 7 keV and a dose of $2\times10^{15}$ $cm^{-2}$. The implanted $B^+$ ions are activated by performing thermal treatment for 10 seconds at 1000° C. This thermal treatment forms a p-type impurity diffusion region 53 in the surface layer of the silicon substrate 51. The implanted $B^+$ ions are diffused during the thermal treatment, a depth of a p-n junction from the substrate surface being set to about 0.15 μm.

The process of forming the semiconductor device shown in FIG. 5B will be described. A second ion implantation is performed to implant $B^+$ ions into the active region under the conditions of an acceleration energy of 7 keV and a dose of $8\times10^{15}$ $cm^{-2}$. Laser annealing is performed to activate $B^+$ ions implanted by the second ion implantation. The laser annealing time is set to about several tens ns or shorter so that impurities hardly diffuse during the laser annealing. Therefore, the $B^+$ ions implanted by the second ion implantation don't reach the p-n junction between the p-type impurity diffusion region 53 and substrate. A p-type impurity diffusion region 54 having a higher impurity concentration is therefore formed inside the p-type impurity diffusion region 53. The depth to the bottom of the p-type impurity diffusion region 54 is about 0.1 μm.

Figure 5C:
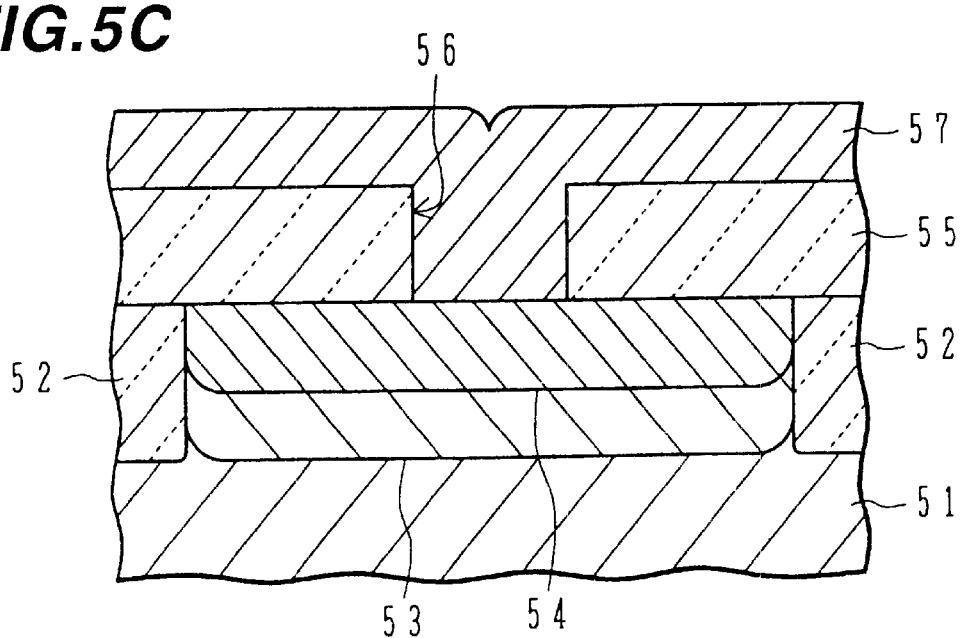

As shown in FIG. 5C, an interlayer insulating film 55 of $SiO_2$ is formed on the substrate surface. A contact hole 56 is formed through the interlayer insulating film 55 to partially expose the surface of the p-type impurity diffusion region 54. A wiring pattern 57 is formed on the interlayer insulating film 55. The wiring pattern electrically contacts the p-type impurity diffusion region 54 via the contact hole 56. The wiring pattern 57 has a lamination structure of a 20 nm thick Ti layer, a 100 nm thick TiN layer and a 400 nm thick Al layer sequentially stacked from the bottom in this order.

Since the impurities in the p-type impurity diffusion region 54 are activated by laser annealing, the concentration of activated impurities can be made higher than when activation is made by RTA. For example, although it is difficult for RTA to set the concentration of activated impurities higher than $1\times10^{20}$ $cm^{-3}$, it is possible for laser annealing to set the concentration of activated impurities much higher. Since the wiring pattern 57 contacts the impurity diffusion region having a high impurity concentration, the contact resistance can be lowered. In order to obtain sufficient reduction effects of the contact resistance, it is preferable to set the concentration of activated impurities in the p-type impurity diffusion area 54 to $5\times10^{20}$ $cm^{-3}$ or higher.

According to evaluation experiments made by the inventor, the contact resistance was able to be lowered by laser annealing by about 1/5 of that not using laser annealing.

Figure 6:
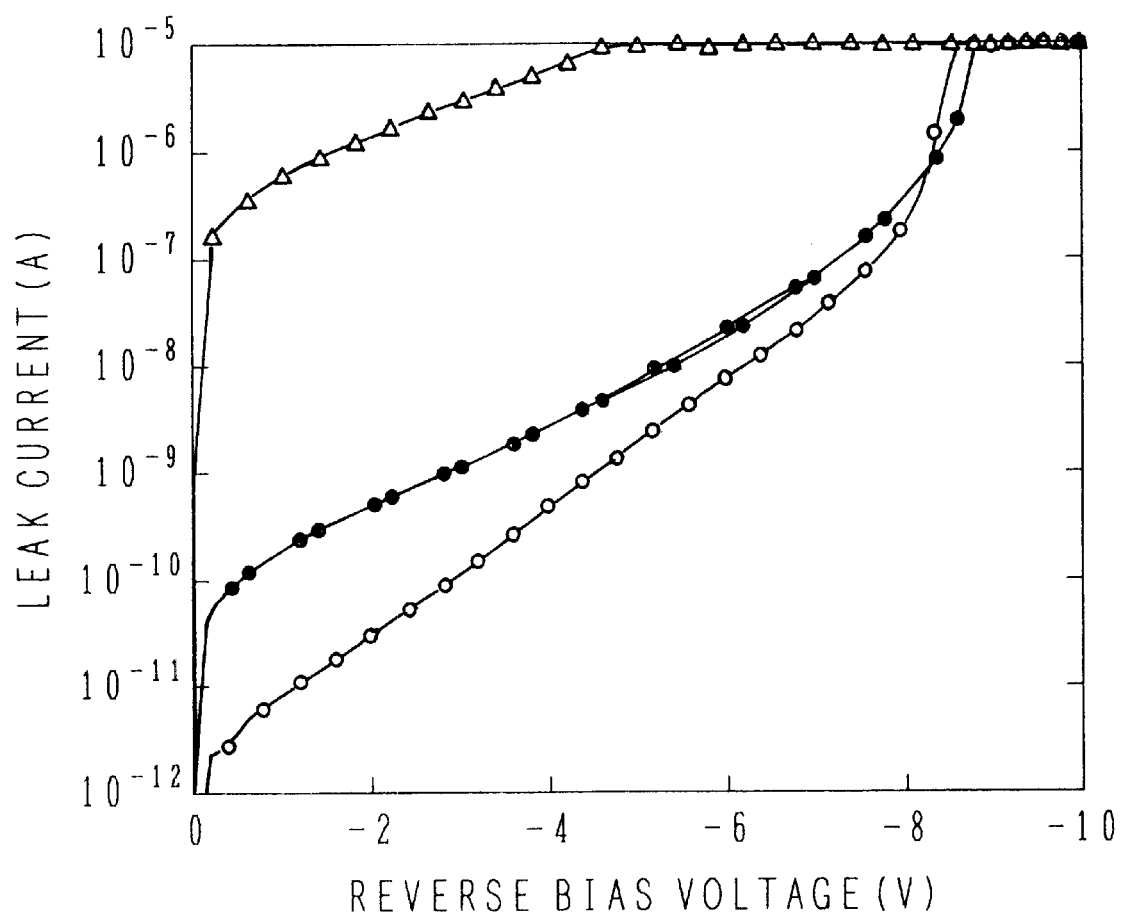
FIG. 6 is a comparison graph showing leak currents between an impurity diffusion region formed by the fifth embodiment method and a substrate, between an impurity diffusion region formed only by laser annealing and a substrate, and between an impurity diffusion region formed only by RTA and a substrate.

FIG. 6 is a graph showing the relation between leak current and inverse bias voltage applied between an impurity diffusion region and substrate. The abscissa represents a reverse bias voltage in the unit of V, and the ordinate represents a leak current in the unit of A. In the graph, black rhomboids and black circles indicate a leak current of the impurity diffusion region formed by the fifth embodiment method. White rhomboids indicate a leak current of an impurity diffusion region formed only by RTA, and white triangles indicate a leak current of an impurity diffusion region formed only by laser annealing.

The leak current of the impurity diffusion region formed only by laser annealing is much larger than that of the impurity diffusion region formed only by RTA. In contrast, the leak current of the impurity diffusion region formed by the fifth embodiment method was slightly larger than that of the impurity diffusion region formed only by RTA, and was much smaller than that of the impurity diffusion region formed only by laser annealing.

When impurities are activated by laser annealing, many defects are generally generated on the p-n junction between the impurity diffusion region and substrate. These defects generated in the p-n junction may cause an increased leak current. In the fifth embodiment, the p-type impurity diffusion region 54 formed by laser annealing is formed inside the p-type impurity diffusion region 53 formed by RTA. In other words, the p-n junction is formed by RTA. An increased leak current may be ascribed to that defects by laser annealing are not generated near at the p-n junction interface.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device, comprising the steps of:
   (a) forming a gate electrode in a partial area of a surface of a semiconductor substrate;
   (b) implanting impurities of a first conductive type into the semiconductor substrate in areas on both sides of the gate electrode, by using the gate electrode as a mask;
   (c) activating the impurities implanted by said first impurity implantation step by applying a laser beam to the surface of the semiconductor substrate;
   (d) implanting impurities for controlling threshold voltage into a surface layer of the semiconductor substrate under the gate electrode, after the laser beam is applied; and
   (e) activating the impurities for controlling threshold voltage by heating the semiconductor substrate, wherein after the step (d) and before the step (e), the method includes the following steps:
   (d1) forming side wall spacers on side walls of the gate electrode; and
   (d2) implanting impurities of the first conductive type into the semiconductor substrate deeper than the impurities of the first conductive type implanted in the step (b), by using the gate electrode and the side wall spacers as a mask.

2. A method of manufacturing a semiconductor device according to claim 1 wherein an implanting condition in the step (b) and a heating condition in the step (e) are decided so that a concentration of impurities implanted in the step (b) and activated in the step (e) is 5×1020 cm−3 or higher.

3. A method of manufacturing a semiconductor device, comprising the steps of:
   (a) forming a gate electrode in a partial area of a surface of a semiconductor substrate;
   (b) implanting impurities of a first conductive type into the semiconductor substrate in areas on both sides of the gate electrode, by using the gate electrode as a mask;
   (c) activating the impurities implanted by said first impurity implantation step by applying a laser beam to the surface of the semiconductor substrate;

(d) implanting impurities for controlling threshold voltage into a surface layer of the semiconductor substrate under the gate electrode, after the laser beam is applied; and (e) activating the impurities for controlling threshold voltage by heating the semiconductor substrate, wherein after the step (b) and before the step (c), the method includes the following steps:

(b1) forming side wall spacers on side walls of the gate electrode; and (b2) implanting impurities of the first conductive type in to the semiconductor substrate deeper than the impurities of the first conductive type implanted in the step (b), by using the gate electrode and the side wall spacers as a mask, wherein said semiconductor substrate is a silicon substrate, and after the step (b1), further comprising a step of forming a metal silicide film on the surface of the semiconductor substrate continuous with the side wall spacer and on an upper surface of the gate electrode.

4. A method of manufacturing a semiconductor device according to claim 3, after the step (b2) and before the step (d), further comprising a step of removing the side wall spacers.

* * * * *